United States Patent
Kondou (10) Patent No.: US 8,927,987 B2
(45) Date of Patent: Jan. 6, 2015

(54) SEMICONDUCTOR DEVICE INCLUDING EXTERNAL CONNECTION PADS AND TEST PADS

(75) Inventor: Hideaki Kondou, Kyoto (JP)

(73) Assignee: Panasonic Corporation, Osaka (JP)

( * ) Notice: Subject to any disclaimer, the term of this patent is extended or adjusted under 35 U.S.C. 154(b) by 106 days.

(21) Appl. No.: 13/036,214

(22) Filed: Feb. 28, 2011

(65) Prior Publication Data

US 2011/0284841 A1 Nov. 24, 2011

(30) Foreign Application Priority Data

May 21, 2010 (JP) ................................. 2010-117745

(51) Int. Cl.
*H01L 23/58* (2006.01)
*H01L 23/00* (2006.01)
*H01L 21/66* (2006.01)

(52) U.S. Cl.
CPC ............... *H01L 24/06* (2013.01); *H01L 22/32* (2013.01); *H01L 24/14* (2013.01); *H01L 24/05* (2013.01); *H01L 2224/0401* (2013.01); *H01L 2224/05572* (2013.01); *H01L 2224/0603* (2013.01); *H01L 2224/06051* (2013.01); *H01L 2224/06515* (2013.01); *H01L 2924/01077* (2013.01); *H01L 2924/01082* (2013.01); *H01L 2224/14131* (2013.01); *H01L 2224/14133* (2013.01); *H01L 2224/0392* (2013.01); *H01L 2224/05599* (2013.01); *H01L 2924/00013* (2013.01); *H01L 2924/01005* (2013.01); *H01L 2924/01006* (2013.01); *H01L 2924/01033* (2013.01); *H01L 2924/00014* (2013.01)
USPC ........................................... 257/48; 257/723

(58) Field of Classification Search
USPC ........................................................ 257/48
See application file for complete search history.

(56) References Cited

U.S. PATENT DOCUMENTS

| 5,956,567 | A | 9/1999 | Tomita | |
|---|---|---|---|---|
| 6,590,225 | B2 * | 7/2003 | Whetsel et al. | 257/48 |
| 6,770,906 | B2 * | 8/2004 | Corbett et al. | 257/48 |
| 6,940,093 | B2 * | 9/2005 | Eldridge et al. | 257/48 |
| 7,164,149 | B2 * | 1/2007 | Matsubara | 257/48 |
| 7,342,248 | B2 * | 3/2008 | Sorimachi | 257/48 |
| 7,400,134 | B2 * | 7/2008 | Morishita et al. | 324/762.02 |
| 7,834,350 | B2 * | 11/2010 | Jeong | 257/48 |
| 7,868,454 | B2 * | 1/2011 | Lin | 257/738 |
| 8,120,024 | B2 * | 2/2012 | Song et al. | 257/48 |
| 2004/0150007 | A1 | 8/2004 | Kumagae et al. | |
| 2004/0232548 | A1 | 11/2004 | Maruko | |
| 2006/0279315 | A1 | 12/2006 | Takagi et al. | |
| 2006/0286689 | A1 | 12/2006 | Watase et al. | |
| 2007/0090854 | A1 | 4/2007 | Hanaoka | |
| 2008/0258285 | A1 * | 10/2008 | Harper et al. | 257/686 |
| 2008/0308798 | A1 * | 12/2008 | Komatsu | 257/48 |

FOREIGN PATENT DOCUMENTS

| JP | 63-244853 | 10/1988 |
|---|---|---|
| JP | 8-227921 | 9/1996 |
| JP | 2001-110858 | 4/2001 |
| JP | 2002-090422 | 3/2002 |
| JP | 2004-191212 | 7/2004 |
| JP | 2004-207501 | 7/2004 |
| JP | 2006-245319 | 9/2006 |
| JP | 2007-013146 | 1/2007 |

* cited by examiner

*Primary Examiner* — Eugene Lee (57) ABSTRACT

A semiconductor device according to one embodiment of this invention includes: a semiconductor chip; a plurality of external connection pads and a plurality of first test pads, both of which are formed in a central region of a top surface of the semiconductor chip; a plurality of external connection electrodes each formed on a corresponding one of the external connection pads, the external connection electrodes being for connecting the external connection pads and an outside of the semiconductor device.

13 Claims, 7 Drawing Sheets

FIG. 9

SEMICONDUCTOR DEVICE INCLUDING EXTERNAL CONNECTION PADS AND TEST PADS

BACKGROUND OF THE INVENTION (1) Field of the Invention

The present invention relates to semiconductor devices and methods of manufacturing the semiconductor devices, and in particular, to a semiconductor device which includes external connection pads and test pads.

(2) Description of the Related Art

With advancement in integration and functions of semiconductor devices (semiconductor integrated circuits), power consumption of semiconductor devices are increasing. At the same time, with the miniaturization of the processes, wire resistance and wire length are also increasing. In regards to this, in the structure where electrode pads are arranged on the periphery of a chip, a problem exists where securing stable power supply and stable circuit operation is difficult. In particular, at the time of screening in a wafer state with use of probe needles, resistance of the probes is further added, making the problem more noticeable.

There is a technique, for example, disclosed in Japanese Patent Application Publication No. 8-227921 (hereinafter, referred to as Patent Document 1) which addresses the problem that occurs at the time of screening in a wafer state with the structure where electrode pads for assembly and packaging are arranged on the periphery of the chip.

However, with further advancement in the integration and functions, there is a demand for securing stable power supply and stable circuit operation even after the assembly. In order to meet such demand, there is a proposed method which takes measures in the assembly and packaging. More specifically, the wire length within a chip is reduced by arranging area pads across the entire chip surface. This reduces the voltage decrease of power supply.

However, in the case of surface mount, there is a concern in reliability of assembly of bump connection portions. In order to address the concern, there is a technique where a pad region is separated, which is, for example, disclosed in Japanese Patent Application Publication No. 2002-90422 (hereinafter, referred to as Patent Document 2). Furthermore, for example, Japanese Patent Application Publication No. 2004-207501 (hereinafter, referred to as Patent Document 3) discloses a structure of an LSI chip where probing test pads are arranged on the periphery of the chip and surface mount pads are arranged in an area array in the region other than the periphery.

SUMMARY OF THE INVENTION

However, a problem exists in Patent Documents 2 and 3 where the increase in the pad region results in the increase in the chip area. Accordingly, chip cost also increases.

Furthermore, Patent Literature 3 has a further problem where resistance to the inside of the chip increases at the screening in a wafer state with use of probe needles.

In addition, there is a strong demand for a reduced TAT (Turn-Around Time) in the development of the semiconductor processes and the semiconductor devices. Under such conditions, increased efficiency of the screening at the initial phase of the wafer of the semiconductor device is a key factor for improving the semiconductor processes and the semiconductor devices in their early development stages.

The present invention has an object to provide a semiconductor device which is capable of reducing a power-supply voltage drop (IR drop) at the time of screening in a wafer state, while reducing an increase in the chip area.

In order to achieve the object, a semiconductor device according to an aspect of the present invention includes: a semiconductor chip; a plurality of external connection pads and a plurality of first test pads, both of which are formed in a central region of a top surface of the semiconductor chip; and a plurality of external connection electrodes each formed on a corresponding one of the external connection pads, the external connection electrodes being for connecting the external connection pads and an outside of the semiconductor device.

With the structure, in the semiconductor device according to an aspect of the present invention, test pads are arranged in a central region of a chip. Accordingly, for example, the number of test pads arranged on the periphery of the chip can be reduced; and thus, the semiconductor device according to an aspect of the present invention is capable of reducing the chip area. Furthermore, at the time of screening, the power-supply voltage drop (IR drop) can be reduced by supplying power to the test pads arranged in the central region of the chip. Accordingly, the semiconductor device according to an aspect of the present invention is capable of performing stable screening even on a high speed circuit or a large scale circuit. Therefore, the semiconductor device according to an aspect of the present invention is capable of achieving a short TAT in the development. In addition, test pads and external connection pads are separately provided; and thus, the semiconductor device according to an aspect of the present invention increases yield rate and reliability in the forming process of the external connection electrodes.

Furthermore, it may be that a plurality of pads, including the external connection pads and the first test pads, are arranged in a matrix.

It also may be that the external connection pads are arranged in a matrix.

It also may be that each of the first test pads is disposed between adjacent ones of the external connection pads.

With these structures, in the semiconductor device according to an aspect of the present invention, a plurality of external connection pads can be arranged with the same interval without any missing, independently of the layout of the test pads. Accordingly, sealing resin or the like can be stably fed in the semiconductor device according to an aspect of the present invention, which increases reliability in the manufacturing process.

It may be that the first test pads are smaller than the external connection pads.

With the structure, the semiconductor device according to an aspect of the present invention may have a chip layout where regions between adjacent pads can be effectively used as rooting regions. As a result, the semiconductor device according to an aspect of the present invention is capable of reducing the chip cost.

Furthermore, it may be that the first test pads have a planar shape identical to a planar shape of the external connection pads.

With the structure, it is possible to prevent an increase in complexity and man-hour in pad layout design which occurs due to, for example, an increase in the types of cell layout. Accordingly, the semiconductor device according to an aspect of the present invention facilitates design.

Furthermore, it may be that the semiconductor device includes a plurality of circuits formed on the semiconductor chip, and the first test pads are arranged above a circuit having a greatest power consumption among the circuits.

With the structure, the semiconductor device according to an aspect of the present invention achieves most efficient power supply which further reduces the power-supply voltage drop (IR drop) or the number of the test pads.

Furthermore, it may be that the semiconductor device further includes a plurality of second test pads formed on a periphery of the top surface of the semiconductor chip.

With the structure, it is possible to reduce the number of test pads formed within the central region of the chip. Accordingly, for example, regions between adjacent pads can be effectively used as rooting regions. As a result, the semiconductor device according to an aspect of the present invention is capable of reducing the chip cost.

A method of manufacturing a semiconductor device according to an aspect of the present invention includes: forming a plurality of external connection pads and a plurality of first test pads in a central region of a top surface of a semiconductor chip; and forming a plurality of external connection electrodes each on a corresponding one of the external connection pads, the external connection electrodes being for connecting the external connection pads and an outside of the semiconductor device.

With the structure, in the semiconductor device manufactured by a manufacturing method according to an aspect of the present invention, test pads are arranged in the central region of the chip. Accordingly, for example, the number of test pads arranged on the periphery of the chip can be reduced; and thus, the semiconductor device manufactured by the manufacturing method according to an aspect of the present invention is capable of reducing the chip area. Furthermore, at the time of screening, the power-supply voltage drop (IR drop) can be reduced by supplying power to the test pads arranged in the central region of the chip. Accordingly, the method of manufacturing the semiconductor device according to an aspect of the present invention is capable of performing stable screening even on a high speed circuit or a large scale circuit. Therefore, the manufacturing method of the semiconductor device according to an aspect of the present invention is capable of achieving a short TAT in the development. In addition, test pads and external connection pads are separately provided; and thus, the method of manufacturing the semiconductor device according to an aspect of the present invention increases yield rate and reliability in the forming process of the external connection electrodes.

Furthermore, it may be that in the forming of a plurality of external connection pads and a plurality of first test pads, a plurality of pads, including the external connection pads and the first test pads, are arranged in a matrix.

It may also be that in the forming of a plurality of external connection pads and a plurality of first test pads, the external connection pads are arranged in a matrix.

It may also be that in the forming of a plurality of external connection pads and a plurality of first test pads, each of the first test pads is disposed between adjacent ones of the external connection pads.

With these structures, in the semiconductor device manufactured by the manufacturing method according to an aspect of the present invention, a plurality of external connection pads can be arranged with the same interval without any missing, independently of the layout of the test pads. Accordingly, sealing resin or the like can be stably fed; and thus, the method of manufacturing the semiconductor device according to an aspect of the present invention increases reliability in the manufacturing process.

It may be that in the forming of a plurality of external connection pads and a plurality of first test pads, a plurality of second test pads are formed on a periphery of the top surface of the semiconductor chip.

With the structure, it is possible to reduce the number of test pads formed within the central region of the chip. Accordingly, for example, regions between adjacent pads can be effectively used as rooting regions. As a result, the manufacturing method according to an aspect of the present invention allows reduction in the chip cost of the semiconductor device.

Furthermore, it may be that the method of manufacturing a semiconductor device further includes performing a screening test by using the first test pads, after the forming of a plurality of external connection pads and a plurality of first test pads, in which the forming of a plurality of external connection electrodes is performed after the performing of a screening test.

With this, the method of manufacturing the semiconductor device according to an aspect of the present invention allows reliable test to be easily performed.

Accordingly, the present invention provides a semiconductor device which is capable of reducing power-supply voltage drop (IR drop) at the time of screening in a wafer state, while reducing an increase in the chip area.

FURTHER INFORMATION ABOUT TECHNICAL BACKGROUND TO THIS APPLICATION

The disclosure of Japanese Patent Application No. 2010-117745 filed on May 21, 2010 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, embodiments of a semiconductor device according to the present invention will be described with reference to the drawings.

(Embodiment 1)

A semiconductor device according to Embodiment 1 of the present invention includes external connection pads and test pads arranged in the central region of a chip. With this structure, the semiconductor device according to Embodiment 1 of the present invention reduces a power-supply voltage drop at the time of screening in a wafer state, while reducing an increase in the chip area.

Figure 1:
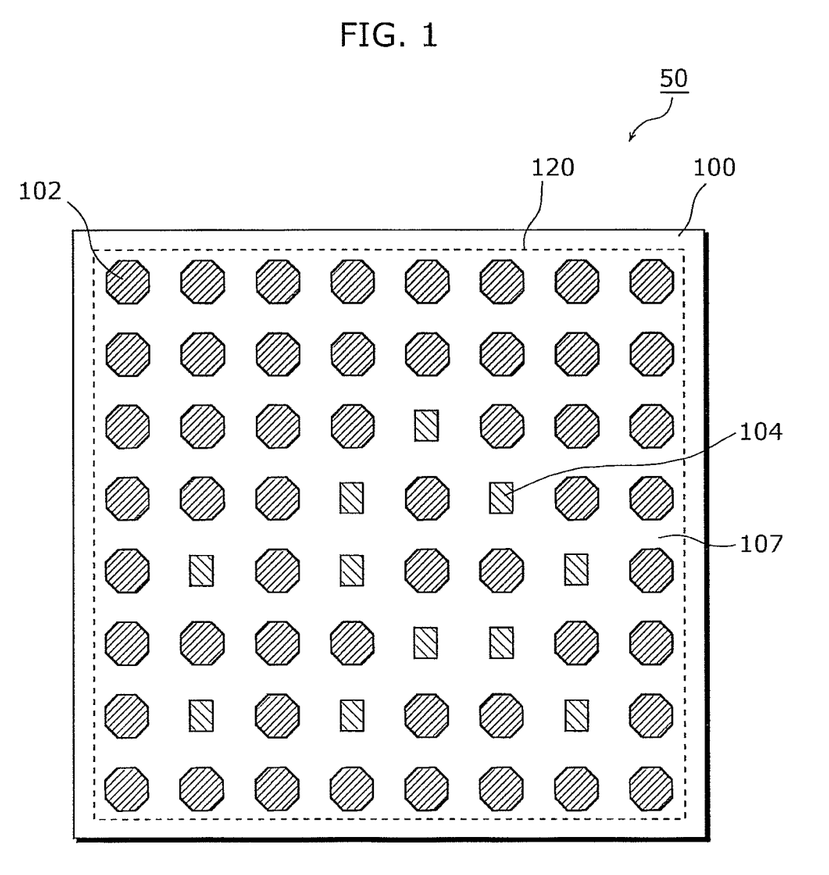
FIG. 1 is a diagram of a pad layout of a semiconductor device according to Embodiment 1 of the present invention.

FIG. 1 is a diagram of a pad layout of a semiconductor device 50 according to Embodiment 1 of the present invention.

The semiconductor device 50 shown in FIG. 1 is a semiconductor integrated circuit used for packaging of surface mount such as an area array. The semiconductor device 50 includes a semiconductor chip 100, external connection pads 102, test pads 104, and a protective film 107.

The semiconductor chip 100 is formed of, for example, an Si substrate. The semiconductor chip 100 has an upper surface having a central region referred to as a chip central region 120.

In the chip central region 120, electrode pads are arranged in an area array (in a matrix). Each of the electrode pads is either the external connection pad 102 or the test pad 104.

Here, the external connection pads 102 are pads used for assembly and packaging. The test pads 104 are pads used for probe test performed in a bare wafer state after the diffusion process.

Figure 2:
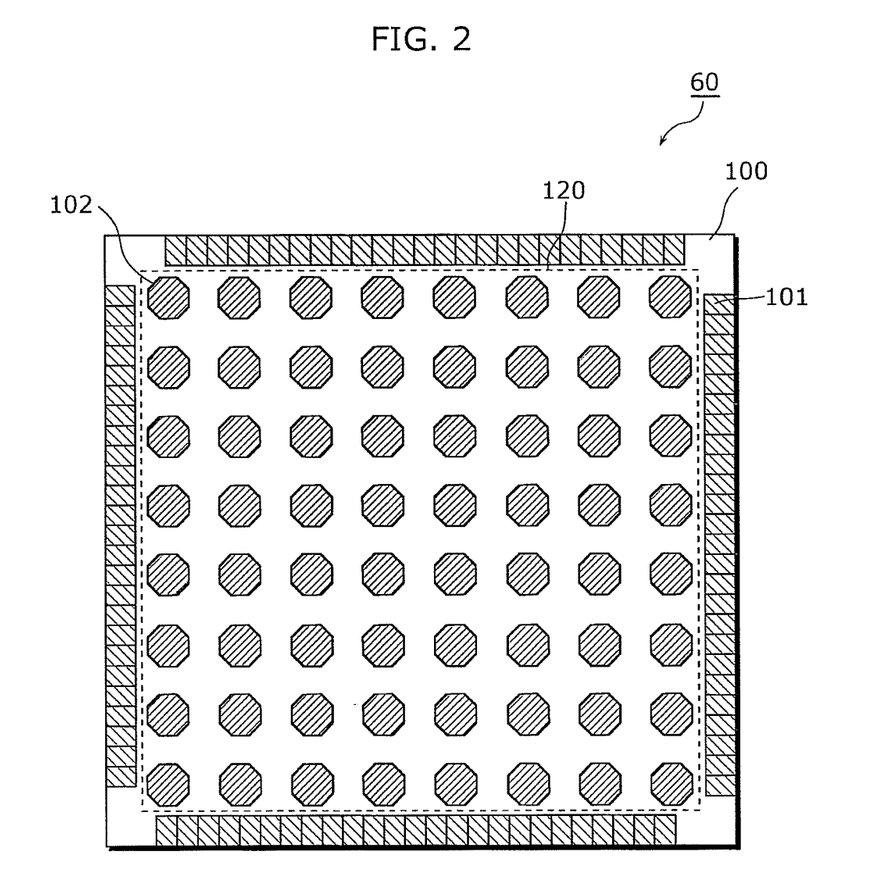
FIG. 2 is a diagram of a pad layout of a semiconductor device according to a comparative example of the present invention.

FIG. 2 is a diagram for comparison, and a layout diagram illustrating a pad structure of a semiconductor device 60 where only external connection pads 102 are arranged in an area array in the chip central region 120.

In the semiconductor device 50 according to Embodiment 1 of the present invention, some of the external connection pads 102 arranged in an area array in the semiconductor device 60 shown in FIG. 2 are selectively replaced with the test pads 104.

The protective film 107 is formed above the semiconductor chip 100. The protective film 107 has openings provided on the respective electrode pads.

Here, by arranging the test pads 104 only in the chip central region 120, the periphery region of the semiconductor chip can be reduced. Accordingly, the semiconductor device 50 according to Embodiment 1 of the present invention can reduce the chip area, which also allows the reduction in the chip cost.

Figure 3:
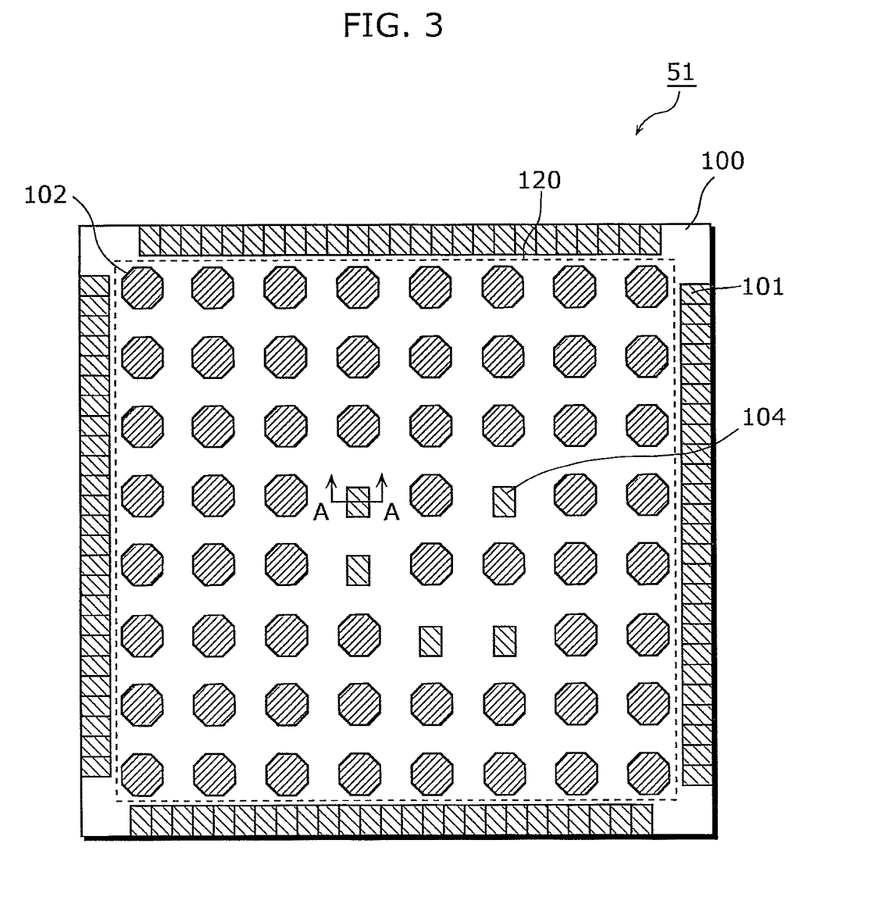
FIG. 3 is a diagram of a pad layout of the semiconductor device according to Embodiment 1 of the present invention.

On the other hand, as in a semiconductor device 51 shown in FIG. 3, test pads 101 may be arranged on the periphery of the chip central region 120 (the periphery of the semiconductor chip 100). The test pads 101 are pads used for probe test performed in a bare wafer state after the diffusion process, similar to the test pads 104.

Such layout allows the reduction in the number of test pads 104 formed in the chip central region 120. However, the test pads 104 are formed on the periphery of the chip central region 120 in the semiconductor device 51, which may lead to the increase in the chip size. Therefore, this results in a trade-off between efficiency of the screening in a bare wafer state and the increase in the chip cost due to the increase in the chip size.

As shown in FIG. 3, the respective external connection pads 102 have, for example, an octagonal shape that is suitable for bump formation on the pads. In the drawings, wires, such as wires from pads to internal circuits, are omitted for simplicity.

Figure 4:
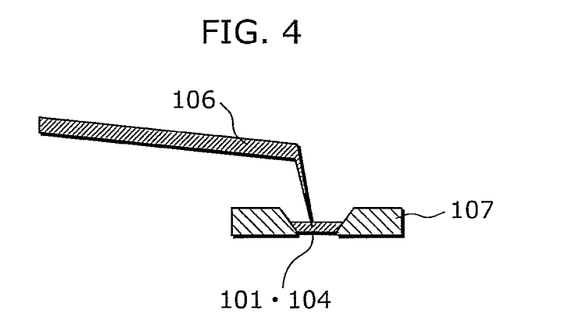
FIG. 4 is a cross-sectional view schematically illustrating a state of a probe test performed on a test pad according to Embodiment 1 of the present invention.

FIG. 4 is a cross-sectional view taken along plane A to A shown in FIG. 3. As shown in FIG. 4, the semiconductor device 51 after the diffusion process undergoes a probe test where probe needles 106 are applied to the test pads 101 and 104 in a bare wafer state.

Other than the openings of the respective electrode pads that are the external connection pads 102, and the test pads 101 and 104, the top surface of the semiconductor chip 100 is covered with the protective film 107.

Power-supply voltage and test signals are supplied to the semiconductor device 51 via the test pads 101 from the probe needles 106, and power-supply voltage is also supplied to the test pads 104 at the same time.

Generally, a power-supply noise and power-supply voltage drop (IR drop) are generated at the time of the probe test, depending on the circuit speed and the operating scale of the semiconductor device 51. The IR drop becomes more noticeable in the portions that are farther from the supply source of the power-supply voltage via wire resistance. However, Embodiment 1 of the present invention achieves a stable circuit operation because the power-supply voltage is also supplied from the test pads 104 arranged in the chip central region 120. Accordingly, in the case where the circuit operates at a high speed or where the circuit scale increases, screening can be performed with stable power-supply voltage.

Figure 5:
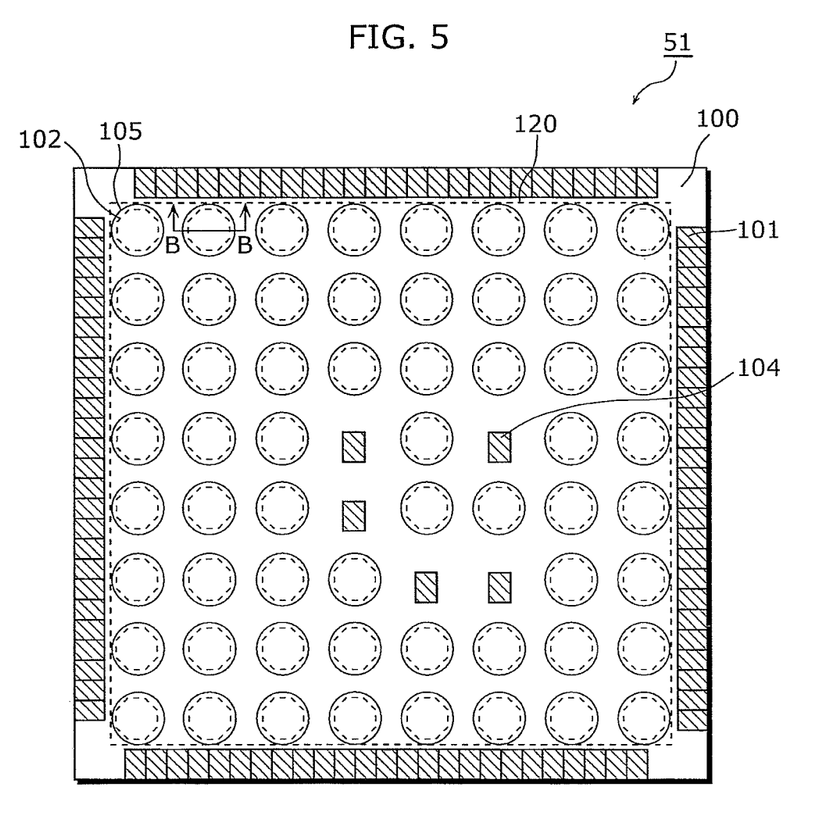
FIG. 5 is a diagram of a pad layout of the semiconductor device according to Embodiment 1 of the present invention.

FIG. 5 is a diagram illustrating a structure of the semiconductor device 51 after the probe test. As shown in FIG. 5, the semiconductor device 51 further includes bumps 105 that are external connection electrodes for connecting the external connection pads 102 and the outside of the semiconductor device 51. The bumps 105 are formed on the external connection pads 102.

Figure 6:
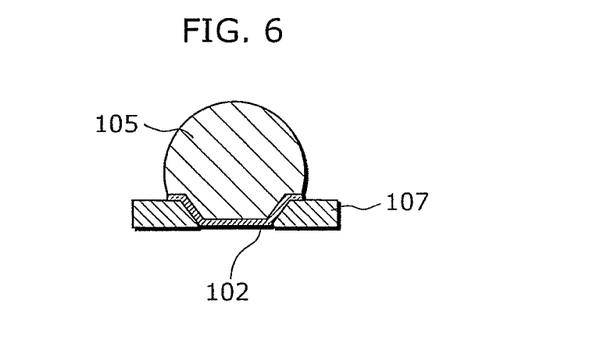
FIG. 6 is a cross-sectional view schematically illustrating a state where a bump is formed on an external connection pad according to Embodiment 1 of the present invention.

FIG. 6 is a cross-sectional view taken along plane B to B shown in FIG. 5. Similar to FIG. 4, the top surface of the semiconductor chip 100 other than the openings of the respective pads are covered with the protective film 107.

In FIG. 5, the bumps 105 are formed on the external connection pads 102, but not on the test pads 101 and the test pads 104. The probe test is performed on the test pads 101 and 104; and thus, the external connection pads 102 do not receive any damage such as pressure from the probe needles 106. Therefore, the semiconductor device 51 according to Embodiment 1 of the present invention increases the yield rate and reliability in the bump forming process.

As described, the semiconductor device 51 according to Embodiment 1 of the present invention includes the external connection pads 102 and test pads 104 arranged in the chip central region 120.

Accordingly, the semiconductor device 51 according to Embodiment 1 of the present invention is capable of reducing the number of the test pads 101 arranged on the periphery of the chip, which allows the reduction in the chip area.

Furthermore, since the test pads 104 are formed in the chip central region 120, it is possible to supply power-supply voltage also from the test pads 104 at the probe test. With this, the semiconductor device 51 reduces the power-supply voltage drop (IR drop) at the time of the probe test. Therefore, the semiconductor device 51 is capable of performing stable screening even on a high speed circuit or a large scale circuit.

In the case of concurrent engineering of the diffusion process and the semiconductor device, the result of the screening in a bare wafer state becomes a feed back for facilitating development, which leads to a short TAT in the development.

Furthermore, by providing the external connection pads 102 and the test pads 101 and 104 separately, it is possible to increase the yield rate and reliability in the formation process of the bumps 105. In other words, it is possible to increase the yield rate and reliability of the semiconductor device 51.

In the semiconductor device 51, the size of the test pads 104 may be reduced to the minimum necessary for the probe test. By making the test pads 104 smaller than the external connection pads 102 in such a manner, regions between adjacent pads can be effectively used as rooting regions in the chip layout. As a result, the chip cost can be reduced.

Figure 7:
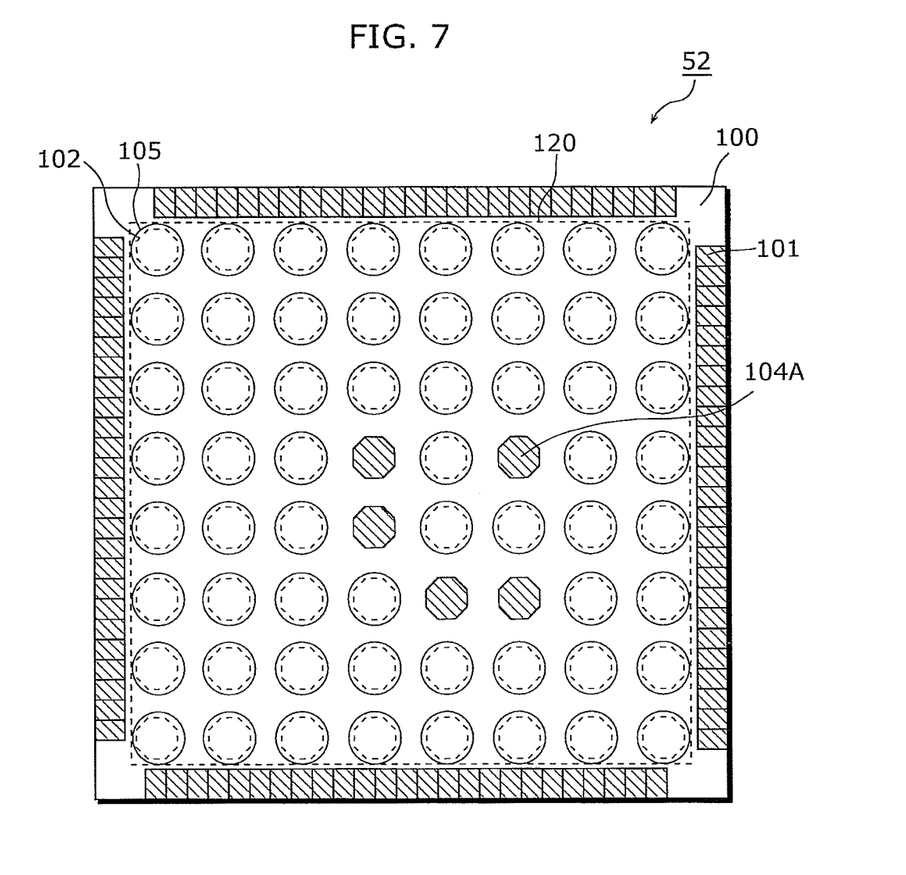
FIG. 7 is a diagram of a pad layout of the semiconductor device according to a variation of Embodiment 1 of the present invention.

As in the semiconductor device 52 shown in FIG. 7, the test pads 104A may have the structure same as that of the external connection pads 102. Here, the external connection pads 102 have, for example, an octagon shape that is suitable for forming the bumps 105 on the pads. The test pads 104A have the planar shape same as that of the external connection pads 102 and also have the octagon shape.

In this case, the pad layout diagram of the semiconductor device after the diffusion process is the same as the pad layout diagram of the semiconductor device 60 shown in FIG. 2. Thus, with use of the semiconductor device 52 shown in FIG. 7, it is possible to prevent an increase in complexity and man-hour in pad layout design which occurs due to, for example, an increase in the types of cell layout. As a result, the semiconductor device 52 facilitates the pad layout design.

The bumps 105 are formed on the external connection pads 102, but not on the test pads 101 and the test pads 104A.

Thus, although the external connection pads 102 and the test pads 104A have the same pad structure, the external connection pads 102 do not receive any damages such as indentation produced on the electrode pads by the probe needles 106. Accordingly, similar to the semiconductor device 51 described above, the semiconductor device 52 is capable of increasing the yield rate and reliability in the forming process of the bumps 105.

Hereinafter, a method of manufacturing the semiconductor device 51 according to Embodiment 1 of the present invention will be described.

First, the semiconductor chip 100 is formed which includes a plurality of circuits. Next, the external connection pads 102, the test pads 101 and 104 are formed on a top surface of the semiconductor chip 100. Then, on the semiconductor chip 100 on which the external connection pads 102 and the test pads 101 and 104 are formed, the protective film 107 is formed which has openings above the external connection pads 102, and the test pads 101 and 104. With the above processes, the structure shown in FIG. 3 is formed.

Next, a screening test is performed using the test pads 101 and 104.

Then, the bumps 105 are formed on the external connection pads 102. With the above processes, the structure shown in FIG. 5 is formed.

(Embodiment 2)

Figure 8:
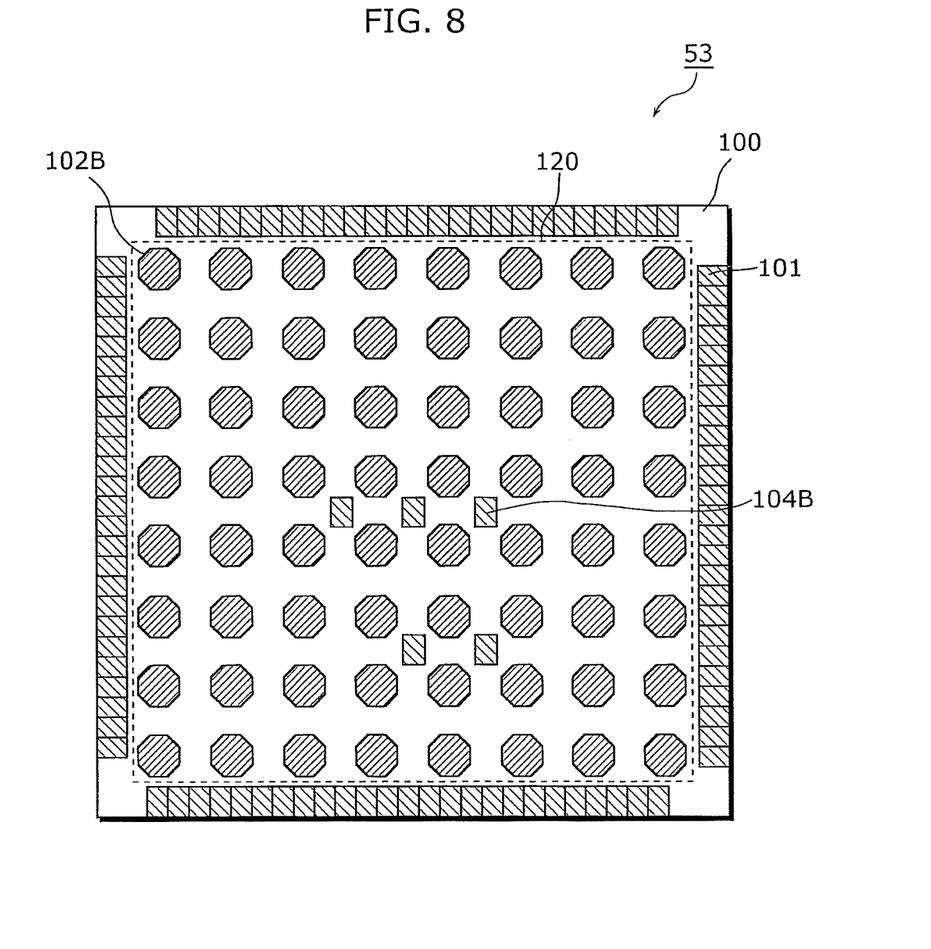
FIG. 8 is a diagram of a pad layout of a semiconductor device according to Embodiment 2 of the present invention.

FIG. 8 is a diagram of a pad layout of a semiconductor device 53 according to Embodiment 2 of the present invention.

In the semiconductor device 53 shown in FIG. 8, similar to the semiconductor device 51 according to Embodiment 1, electrode pads are arranged in an area array in a chip central region 120 of a semiconductor chip 100. In the semiconductor device 51 according to Embodiment 1, electrode pads including the external connection pads 102 and the test pads 104 are arranged in an area array; however, in the semiconductor device 53 according to Embodiment 2, only external connection pads 102B are arranged in an area array, and test pads 104B are arranged in the spaces between adjacent external connection pads 102B arranged in the area array.

Similar to Embodiment 1, a probe test is performed by applying the probe needles 106 to the test pads 101 and 104B, and the bumps 105 are formed on the external connection pads 102B.

In the semiconductor device 53, the external connection pads 102B are regularly arranged at an equal interval without any missing on the region other than the periphery of the chip. This facilitates the stable feeding of resin in the resin sealing process that is performed after the forming process of the bumps 105. As a result, the semiconductor device 53 is capable of increasing the yield rate and reliability in the sealing process.

As described, in the semiconductor device 53 according to Embodiment 2 of the present invention, the external connection pads 102B that are arranged in the area array are arranged at an equal interval without any missing, independently of the layout of the test pads 104B. The test pads 104B are arranged in the spaces between the adjacent external connection pads 102B. As a result, it is possible to stably feed the sealing resin or the like, which leads to increased reliability of the semiconductor device 53.

(Embodiment 3)

Figure 9:
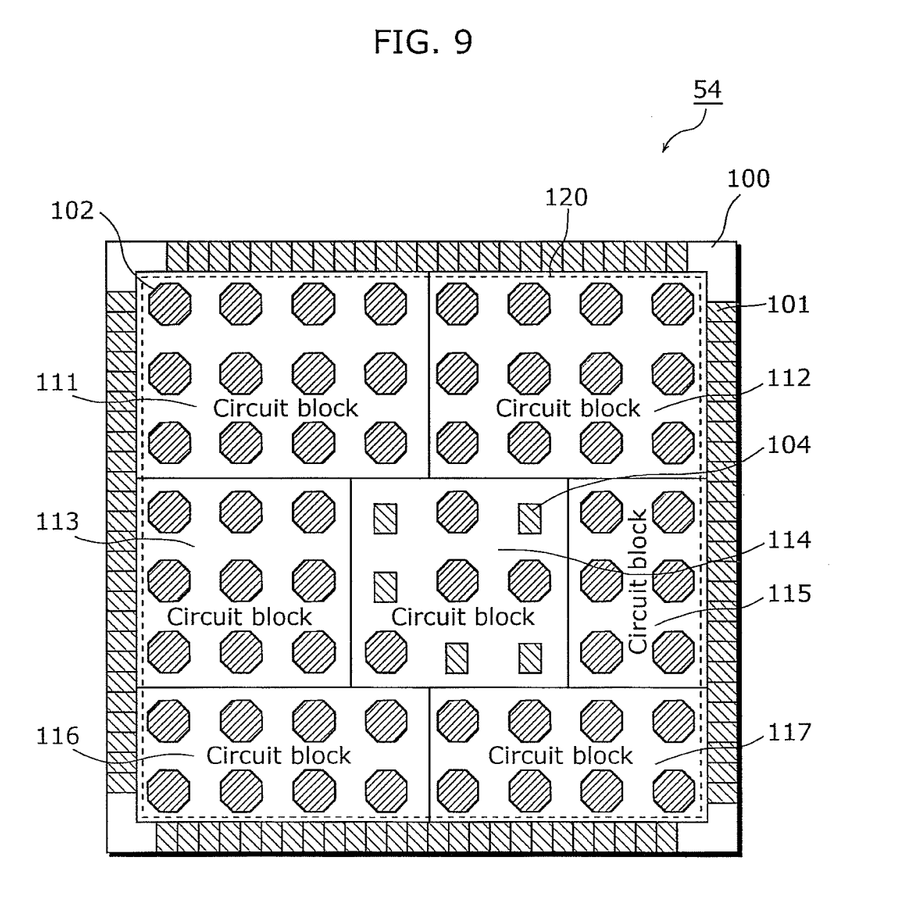
FIG. 9 is a diagram schematically illustrating a circuit block structure and a pad layout structure of a semiconductor device according to Embodiment 3 of the present invention.

FIG. 9 is a diagram of a pad layout of a semiconductor device 54 according to Embodiment 3 of the present invention. The structure of the pad layout is the same as that in Embodiment 1.

The semiconductor device 54 shown in FIG. 9 further includes a plurality of circuit blocks 111 to 117 formed on the semiconductor chip 100.

The test pads 104 are arranged above the circuit block 114 having a greatest power consumption among the circuit blocks 111 to 117.

For example, the circuit block 114 is an ultra-high-speed processor which operates at a higher speed and consumes greater power compared to the other circuit blocks.

Similar to Embodiment 1, a probe test is performed by applying the probe needles 106 to the test pads 101 and 104, and then the bumps 105 are formed on the external connection pads 102.

In such a manner, at the time of the probe test, power-supply voltage is supplied also from the test pads 104; and thus, the circuit operation is stabilized. In particular, power-supply voltage can be supplied to the circuit block 114, which operates at a high speed from immediately above the circuit block 114.

As described, the semiconductor device 54 according to Embodiment 3 achieves a most efficient power supply which further reduces the power-supply voltage drop (IR drop) or the number of the test pads 104, by arranging the test pads 104 above the circuit which operates at a high speed or which consumes the greater power within the semiconductor device 54.

The semiconductor device according to embodiments of the present invention has been described; however, the present invention is not limited to those embodiments.

For example, corners and sides of the respective elements are illustrated with straight lines in the drawings; however, the corners and sides rounded due to manufacturing reasons are also included in the present invention.

The number of electrode pads shown in FIG. 1 and the like has been illustrated for exemplary purposes only, and any number of electrode pads may be included. The layout patterns of the test pads 104, 104A, and 104B have been illustrated for exemplary purposes only, and any other layout patterns may be adopted.

The planar shapes of the external connection pads 102 and 102B, the test pads 101, 104, 104A and 104B have been illustrated for exemplary purposes only, and any other planar shapes may be adopted.

In addition, at least some of the functions of the semiconductor devices and the variations according to Embodiments 1 to 3 may be combined.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Industrial Applicability

The present invention is applicable to semiconductor devices, and is effective particularly for a semiconductor device having surface mount packaging such as an area-array.

What is claimed is:

1. A semiconductor device comprising:
   a semiconductor chip;
   a plurality of first pads, which include a plurality of external connection pads and a plurality of first test pads, the plurality of first pads formed in a central region of a top surface of said semiconductor chip, the plurality of first pads arranged in a matrix in which one of the first test pads and external connection pads are provided in the same line or the same column of the matrix;
   a plurality of second test pads provided on a periphery of the top surface of said semiconductor chip; and
   a plurality of circuits provided on said semiconductor chip;
   wherein a distance between two adjacent first test pads is larger than a distance between two adjacent second test pads,
   wherein said first test pads are arranged only above a circuit having a greatest power consumption among said circuits,
   wherein the device does not include any test pads arranged above other circuits besides the circuit having the greatest power consumption.

2. The semiconductor according to claim 1, wherein said first test pads are smaller than said external connection pads.

3. The semiconductor device according to claim 1, wherein said first test pads have a planar shape identical to a planar shape of said external connection pads.

4. The semiconductor device according to claim 1, wherein said semiconductor chip is formed of an Si substrate.

5. The semiconductor device according to claim 1, wherein only said external connection pads are arranged in a square by at least two rows, and said first test pads are disposed in the square.

6. The semiconductor according to claim 1, wherein said first test pads are smaller than said external connection pads.

7. The semiconductor device according to claim 1, wherein said first test pads have a rectangular shape, and said external connection pads have a shape other than a rectangular shape.

8. The semiconductor device according to claim 1, further comprising a plurality of external connection electrodes each provided on a corresponding one of said external connection pads, wherein
   said external connection electrodes are provided to connect said external connection pads to devices disposed outside of said semiconductor device.

9. The semiconductor according to claim 5, wherein said first test pads are smaller than said external connection pads.

10. The semiconductor device according to claim 9, wherein
    said first test pads have a rectangular shape, and said external connection pads have a shape other than a rectangular shape.

11. The semiconductor device according to claim 10, further comprising a plurality of external connection electrodes each provided on a corresponding one of said external connection pads, wherein
    said external connection electrodes are provided to connect said external connection pads to devices disposed outside of said semiconductor device.

12. The semiconductor device according to claim 1, wherein a size of said first test pads is larger than a size of said second test pads.

13. A semiconductor device, comprising:
    a semiconductor chip;
    a plurality of external connection pads and a plurality of first test pads, both of which are provided in a central region of a top surface of said semiconductor chip;
    a plurality of second test pads provided on a periphery of the top surface of said semiconductor chip, and
    a plurality of circuits provided on said semiconductor chip, wherein
    a distance between two adjacent first test pads is larger than a distance between two adjacent second test pads, and
    said first test pads are arranged only above a circuit having a greatest power consumption among said circuits,
    wherein the device does not include any test pads arranged above other circuits besides the circuit having the greatest power consumption.

* * * * *